United States Patent
Farrell et al.

(10) Patent No.: US 8,588,260 B2
(45) Date of Patent: Nov. 19, 2013

(54) OPTIMIZATION OF LASER BAR ORIENTATION FOR NONPOLAR AND SEMIPOLAR (GA,AL,IN,B)N DIODE LASERS

(75) Inventors: Robert M. Farrell, Goleta, CA (US); Mathew C. Schmidt, Santa Barbara, CA (US); Kwang Choong Kim, Seoul (KR); Hisashi Masui, Santa Barbara, CA (US); Daniel F. Feezell, Santa Barbara, CA (US); James S. Speck, Goleta, CA (US); Stephen P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 376 days.

(21) Appl. No.: 12/908,463

(22) Filed: Oct. 20, 2010

(65) Prior Publication Data
US 2011/0032965 A1 Feb. 10, 2011

Related U.S. Application Data

(63) Continuation of application No. 12/030,124, filed on Feb. 12, 208, now Pat. No. 7,839,903.

(60) Provisional application No. 60/889,516, filed on Feb. 12, 2007.

(51) Int. Cl.
*H01S 3/10* (2006.01)
(52) U.S. Cl.
USPC .................. 372/9; 372/43.01; 372/44.011
(58) Field of Classification Search
USPC ...................... 372/43.01, 44.011, 9
See application file for complete search history.

(56) References Cited

U.S. PATENT DOCUMENTS

| | | | |
|---|---|---|---|
| 5,625,202 A * | 4/1997 | Chai | 257/94 |
| 6,316,785 B1 | 11/2001 | Nunoue et al. | |
| 2001/0030328 A1 | 10/2001 | Ishida | |
| 2001/0048114 A1 | 12/2001 | Morita et al. | |
| 2002/0144645 A1 | 10/2002 | Kim et al. | |
| 2003/0024475 A1 | 2/2003 | Anderson | |

(Continued)

FOREIGN PATENT DOCUMENTS

| | | |
|---|---|---|
| JP | 10-335750 | 12/1998 |
| JP | 2000-68609 | 3/2000 |

(Continued)

OTHER PUBLICATIONS

Coldren, L. et al., "Diode Lasers and Photonic Integrated Circuits," Wiley Interscience, 1995, 138 pgs., Copyright pages, Chapter 4, and Appendices 8-11, New York.

(Continued)

*Primary Examiner* — Dung Nguyen
(74) *Attorney, Agent, or Firm* — Gates & Cooper LLP

(57) ABSTRACT

Optical gain of a nonpolar or semipolar Group-III nitride diode laser is controlled by orienting an axis of light propagation in relation to an optical polarization direction or crystallographic orientation of the diode laser. The axis of light propagation is substantially perpendicular to the mirror facets of the diode laser, and the optical polarization direction is determined by the crystallographic orientation of the diode laser. To maximize optical gain, the axis of light propagation is oriented substantially perpendicular to the optical polarization direction or crystallographic orientation.

20 Claims, 8 Drawing Sheets

(56) References Cited

U.S. PATENT DOCUMENTS

| | | | |
|---|---|---|---|
| 2005/0142391 A1 | 6/2005 | Dmitriev et al. | |
| 2005/0161697 A1 | 7/2005 | Nakahata et al. | |
| 2005/0232327 A1* | 10/2005 | Nomura et al. | 372/50.12 |
| 2005/0258451 A1 | 11/2005 | Saxler et al. | |
| 2007/0280320 A1* | 12/2007 | Feezell et al. | 372/46.01 |
| 2009/0146162 A1* | 6/2009 | Chakraborty et al. | 257/94 |

FOREIGN PATENT DOCUMENTS

| | | |
|---|---|---|
| JP | 2000-216497 | 8/2000 |
| JP | 2001-230497 | 8/2001 |
| WO | 2006/130696 | 12/2006 |

OTHER PUBLICATIONS

Della Sala, F. et al., "Free-carrier screening of polarization fields in wurtzite GaN/InGaN laser structures," Appl. Phys. Lett., Apr. 5, 1999, pp. 2002-2004, vol. 74, No. 14.

Di Carlo, A. et al., "Doping screening of polarization fields in nitride heterostructures," Appl. Phys. Lett., Jun. 26, 2000, pp. 3950-3952, vol. 76, No. 26.

Gardner, N.F. et al., "Polarization anisotropy in the electroluminescence of m-plane InGaN—GaN multiple-quantum-well light-emitting diodes," Appl. Phys. Lett., 2005, pp. 111101-1-111101-3, vol. 86.

Grandjean, N. et al., "Built-in electric-field effects in wurtzite AlGaN/GaN quantum wells," J. Appl. Phys., Oct. 1, 1999, pp. 3714-3720, vol. 86, No. 7.

Im, J.S. et al., "Reduction of oscillator strength due to piezoelectric fields in GaN/$Al_xGa_{1-x}$N quantum wells," Phys. Rev. B, Apr. 15, 1998, pp. R9435-R9438, vol. 57, No. 16.

Koyama, T. et al., "Prospective emission efficiency and in-plane light polarization of nonpolar m-plane $In_xGa_{1-x}$N/GaN blue light emitting diodes fabricated on freestanding GaN substrates," Appl. Phys. Lett., 2006, pp. 091906-1-091906-3, vol. 89.

Lefebvre, P. et al., "High internal electric field in a graded-width InGaN/GaN quantum well: Accuracte determination by time-resolved photoluminescence spectroscopy," Appl. Phys. Lett., Feb. 26, 2001, ppl. 1252-1254, vol. 78, No. 9.

Masui, H. et al., "Polarized Light Emission from Nonpolar InGaN Light-Emitting Diodes Grown on a Bulk m-Plane GaN Substrate," Jpn. J. Appl. Phys., 2005, pp. L1329-1332, vol. 44, No. 43.

Nakamura, S. et al., "InGaN/GaN/AlGaN-based laser diodes with modulation-doped strained-layer superlattices grown on an epitaxially laterally overgrown GaN substrate," Appl. Phys. Lett., Jan. 12, 1998, pp. 211-213, vol. 72, No. 2.

Nakamura, S. et al., "The Blue Laser Diode: The Complete Story," Springer, Heidelberg 1997, 8 pgs. (copyright and table of contents).

Park, S-H.,"Crystal orientation effects on electronic properties of wurtzite InGaN/GaN quantum wells," J. Appl. Phys., Jun. 15, 2002, pp. 9904-9908, vol. 91, No. 12.

Park, S-H., "Crystal Orientation Effects on Many-Body Optical Gain of Wurtzite InGaN/GaN Quantum Well Lasers," Jpn. J. Appl. Phys., Feb. 15, 2003, pp. L170-L172, vol. 42, Part 2, No. 2B.

Park et al., "Effect of (10-10) crystal orientation on many-body optical gain of wurtzite InGaN/GaN quantum well," Journal of Applied Physics, vol. 93, No. 12, Jun. 15, 2003.

Shao, Y. et al., "Electrical Characterization of Semipolar Gallium Nitride Thin Films," NNIN REU Research Accomplishments, Aug. 2005, pp. 132-133.

Suzuki, M. et al., "Biaxial Strain Effect on Wurtzite GaN/AlGaN Quantum Well Lasers," Jpn. J. Appl. Phys., Feb. 1996, pp. 1420-1423, vol. 35, Part 1, No. 2B.

Takeuchi, T. et al., "Quantum-Confined Stark Effect due to Piezoelectric Fields in GaInN Strained Quantum Wells," Jpn. J. Appl. Phys., Apr. 1, 1997, pp. L382-L385, vol. 36, Part 2, No. 4A.

Yablonovitch, E. et al., "Reduction of Lasing Threshold Current Density by the Lowering of Valence Band Effective Mass," J. Lightwave Technology, May 1986, pp. 504-506, vol. LT-4, No. 5.

International Search Report mailed Jun. 26, 2008, International application No. PCT/US2008/001844.

Japanese Office Action dated Sep. 11, 2012 for JP application No. 2009-549143.

\* cited by examiner

OPTIMIZATION OF LASER BAR ORIENTATION FOR NONPOLAR AND SEMIPOLAR (GA,AL,IN,B)N DIODE LASERS

CROSS-REFERENCE TO RELATED APPLICATION

This application is a continuation under 35 U.S.C. Section 120 of co-pending and commonly-assigned U.S. Utility application Ser. No. 12/030,124, filed on Feb. 12, 2008, by Robert M. Farrell, Mathew C. Schmidt, Kwang Choong Kim, Hisashi Masui, Daniel F. Feezell, Daniel A. Cohen, James S. Speck, Steven P. DenBaars, and Shuji Nakamura, entitled "OPTIMIZATION OF LASER BAR ORIENTATION FOR NONPOLAR AND SEMIPOLAR (Ga,Al,In,B)N DIODE LASERS," now U.S. Pat. No. 7,839,903, issued Nov. 23, 2010; which application claims the benefit under 35 U.S.C. Section 119(e) of co-pending and commonly-assigned U.S. Provisional Application Ser. No. 60/889,516, filed on Feb. 12, 2007, by Robert M. Farrell, Mathew C. Schmidt, Kwang Choong Kim, Hisashi Masui, Daniel F. Feezell, Daniel A. Cohen, James S. Speck, Steven P. DenBaars, and Shuji Nakamura, entitled "OPTIMIZATION OF LASER BAR ORIENTATION FOR NONPOLAR (Ga,Al,In,B)N DIODE LASERS," both of which applications are incorporated by reference herein.

BACKGROUND OF THE INVENTION

1. Field of the Invention

The present invention relates to lasers, and in particular to optimization of laser bar orientation for nonpolar or semipolar (Ga,Al,In,B)N diode lasers.

2. Description of the Related Art (Note: This application references a number of different publications as indicated throughout the specification by one or more reference numbers within parentheses, e.g., (Ref. X). A list of these different publications ordered according to these reference numbers can be found below in the section entitled "References." Each of these publications is incorporated by reference herein.)

The usefulness of gallium nitride (GaN) and alloys of (Ga,Al,In,B)N (i.e., "Group-III nitride," also referred to as "III-nitride" or just "nitride") has been well established for fabrication of visible and ultraviolet optoelectronic devices and high power electronic devices. Current state-of-the-art nitride thin films, heterostructures, and devices are grown along the [0001] axis of the würtzite nitride crystal structure, which is shown in FIG. 1A. The total polarization of such films includes both spontaneous and piezoelectric polarization contributions, both of which originate from the single polar [0001] axis of the würtzite nitride crystal structure. When nitride heterostructures are grown pseudomorphically, polarization discontinuities are formed at surfaces and interfaces within the crystal. These discontinuities lead to the accumulation or depletion of carriers at surfaces and interfaces, which in turn produce electric fields. Since the alignment of these polarization-induced electric fields coincides with the typical [0001] growth direction of nitride thin films and heterostructures, these fields have the effect of "tilting" the energy bands of nitride devices.

In c-plane würtzite nitride quantum wells, the "tilted" energy bands (conduction band Ec and valence band Ev) spatially separate the electron wavefunction and hole wavefunction, as illustrated in FIG. 1B. This spatial charge separation reduces the oscillator strength of radiative transitions and red-shifts the emission wavelength. These effects are manifestations of the quantum confined Stark effect (QCSE) and have been thoroughly analyzed for nitride quantum wells (Refs. 1-4). Additionally, the large polarization-induced electric fields can be partially screened by dopants and injected carriers (Refs. 5-6), making the emission characteristics difficult to engineer accurately.

Furthermore, it has been theoretically predicted that pseudomorphic biaxial strain has little effect on reducing the effective hole mass in c-plane würtzite nitride quantum wells (Ref 7). This is in stark contrast to typical III-V zinc-blende InP-based and GaAs-based quantum wells, where anisotropic strain-induced splitting of the heavy hole and light hole bands leads to a significant reduction in the effective hole mass. A reduction in the effective hole mass leads to a substantial increase in the quasi-Fermi level separation for any given carrier density in typical III-V zinc-blende InP-based and GaAs-based quantum wells. As a direct consequence of this increase in quasi-Fermi level separation, much smaller carrier densities are needed to generate optical gain (Ref. 8). However, in the case of the würtzite nitride crystal structure, the hexagonal symmetry and small spin-orbit coupling of the nitrogen atoms in biaxially strained c-plane nitride quantum wells produces negligible splitting of the heavy hole and light hole bands (Ref. 7). Thus, the effective hole mass remains much larger than the effective electron mass in biaxially strained c-plane nitride quantum wells, and very high current densities are needed to generate optical gain in c-plane nitride diode lasers.

One approach to eliminating polarization effects and decreasing the effective hole mass in nitride devices is to grow the devices on nonpolar planes of the crystal. These include the {11-20} planes, known collectively as a-planes, and the {10-10} planes, known collectively as m-planes. Such planes contain equal numbers of gallium and nitrogen atoms per plane and are charge-neutral. Subsequent nonpolar layers are equivalent to one another so the bulk crystal will not be polarized along the growth direction. Moreover, unlike strained c-plane $In_xGa_{1-x}N$ quantum wells, it has been theoretically predicted that strained nonpolar $In_xGa_{1-x}N$ quantum wells should exhibit anisotropic splitting of the heavy hole and light hole bands, which should lead to a reduction in the effective hole mass for such structures (Ref 9). Self-consistent calculations of many-body optical gain for compressively strained $In_xGa_{1-x}N$ quantum wells suggest that the peak gain is very sensitive to effective hole mass and net quantum well polarization and that peak gain should increase dramatically as the angle between a general growth orientation and the c-axis increases, reaching a maximum for growth orientations perpendicular to the c-axis (i.e., on nonpolar planes) (Refs. 10-11).

Commercial c-plane nitride LEDs do not exhibit any degree of polarization anisotropy in their electroluminescence. Nonpolar m-plane nitride LEDs, on the other hand, have demonstrated strong polarization anisotropy in their electroluminescence along the [11-20] axis (Refs. 12-14). This polarization can be attributed to anisotropic strain-induced splitting of the heavy hole and light hole bands in compressively strained m-plane $In_xGa_{1-x}N$ quantum wells, which leads to significant disparities in the [11-20] and [0001] polarized optical matrix elements. Likewise, it can be expected that the optical emission from m-plane nitride diode lasers should show similar polarization anisotropy.

SUMMARY OF THE INVENTION

To overcome the limitations in the prior art described above, and to overcome other limitations that will become apparent upon reading and understanding the present specification, the present invention discloses a nonpolar or semipolar Group-III nitride diode laser, wherein optical gain is controlled by orienting an axis of light propagation in relation to the optical polarization direction or crystallographic orientation of the diode laser.

Specifically, the axis of light propagation is substantially perpendicular to the mirror facets of the diode laser, and the optical polarization direction is determined by the crystallographic orientation of the diode laser.

In this regard, the axis of light propagation is oriented substantially perpendicular to the optical polarization direction to maximize optical gain. Specifically, the axis of light propagation is oriented substantially along a c-axis of the nonpolar or semipolar Group-III nitride diode laser to maximize optical gain.

In other words, the optical gain is substantially maximized when a dot product of a first vector lying along a c-axis of the nonpolar or semipolar Group-III nitride diode laser and a second vector lying along the axis of light propagation is equal to 1. In addition, the optical gain is substantially minimized when a dot product of a first vector lying along a c-axis of the nonpolar or semipolar Group-III nitride diode laser and a second vector lying along the axis of light propagation is equal to 0.

When the nonpolar Group-III nitride diode laser is an m-plane Group-III nitride diode laser, and the axis of light propagation is oriented at an angle between a c-axis and an a-axis of the m-plane Group-III nitride diode laser, the optical gain decreases monotonically when rotating the axis of light propagation from the c-axis to the a-axis, with the optical gain approaching a maximum when the axis of light propagation is oriented along the c-axis.

When the nonpolar Group-III nitride diode laser is an a-plane Group-III nitride diode laser, and the axis of light propagation is oriented at an angle between a c-axis and an m-axis of the nonpolar Group-III nitride diode laser, the optical gain decreases monotonically when rotating the axis of light propagation from the c-axis to the m-axis, with the optical gain approaching a maximum when the axis of light propagation is oriented along the c-axis.

When the Group-III nitride diode laser is a semipolar Group-III nitride diode laser, the optical gain approaches a maximum when the axis of light propagation is oriented along a c-axis of the semipolar Group-III nitride diode laser and the optical gain approaches a minimum when the axis of light propagation is oriented along an m-axis or an a-axis of the semipolar Group-III nitride diode laser.

These and other aspects of the present invention are described in more detail below.

BRIEF DESCRIPTION OF THE DRAWINGS

Referring now to the drawings in which like reference numbers represent corresponding parts throughout.

DETAILED DESCRIPTION OF THE INVENTION

Figure 1A:
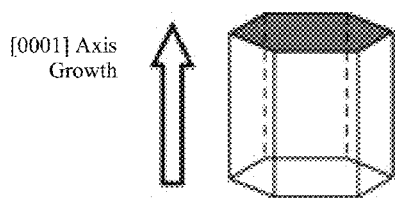
FIG. 1 illustrates the band bending in compressively strained $In_xGa_{1-x}N$ quantum wells due to polarization-induced electric fields.
Figure 1B:
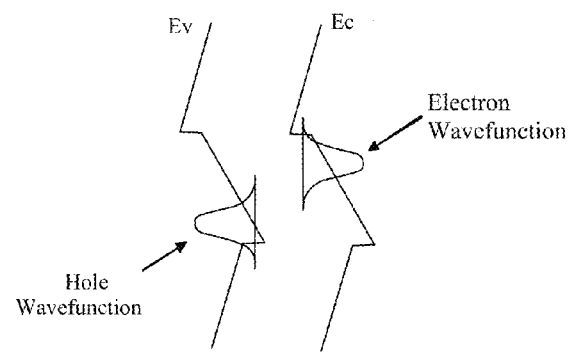

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention is related to semiconductor materials, methods, and devices, and more particularly, to the growth and fabrication of a nonpolar or semipolar Group-III nitride diode laser, wherein the optical gain for the nonpolar or semipolar Group-III nitride diode laser is controlled by orienting the axis of light propagation in relation to the optical polarization direction resulting from the crystallographic orientation of the semiconductor materials used in the nonpolar or semipolar Group-III nitride diode lasers.

These nonpolar or semipolar Group-III nitride diode lasers may be grown directly on free-standing nonpolar or semipolar (Ga,Al,In,B) substrates or on nonpolar or semipolar (Ga,Al,In,B)N template layers pre-deposited on a foreign substrate. Vapor phase epitaxy techniques, such as metalorganic chemical vapor deposition (MOCVD) and hydride vapor phase epitaxy (HYPE), can be used to grow the nonpolar or semipolar (Ga,Al,In,B)N diode laser structures. However, the invention is equally applicable to nonpolar or semipolar (Ga,Al,In,B)N diode laser growth by molecular beam epitaxy (MBE) or any other suitable growth technique.

Growth of nonpolar or semipolar nitride thin films and heterostructures offers a means of eliminating or reducing polarization effects and reducing the effective hole mass in würtzite nitride device structures. The term "nitrides" refers to any alloy composition of the (Ga,Al,In,B)N semiconductors having the formula $Ga_wAl_xIn_yB_zN$ where $0 \le w \le 1$, $0 \le x \le 1$, $0 \le y \le 1$, $0 \le z \le 1$, and $w+x+y+z=1$. Current commercially-available nitride diode lasers are grown along the polar [0001] c-direction. The associated polarization-induced electric fields and the inherently large effective hole mass are detrimental to the performance of state-of-the-art nitride diode lasers. Growth of these devices on nonpolar planes (i.e., m-plane or a-plane) could significantly improve device performance by eliminating polarization-induced electric fields and reducing the effective hole mass. Both of these effects should help to decrease the current densities necessary to generate optical gain in nitride diode lasers.

The present invention provides that nonpolar or semipolar nitride laser bars need to be properly oriented with regards to the planes of the semiconductor crystal to generate maximum gain and realize the aforementioned benefits of nonpolar or semipolar nitride diode lasers. For in-plane diode lasers, the term "longitudinal axis" refers to the axis that is perpendicular to the mirror facets.

For m-plane nitride diode lasers, the optical gain should be maximum for laser bars oriented along the c-axis and minimum for laser bars oriented along the a-axis, due to the inherent optical polarization of compressively strained m-plane $In_xGa_{1-x}N$ quantum wells. Furthermore, for laser bars oriented at angles in between the c-axis and a-axis, the optical gain should decrease monotonically when rotating the longitudinal axis of the laser bars from the c-axis to the a-axis, with optimal laser bar orientations lying on or close to the c-axis.

Likewise, for a-plane nitride diode lasers, the optical gain should be maximum for laser bars oriented along the c-axis and minimum for laser bars oriented along the m-axis due to the inherent optical polarization of compressively strained a-plane $In_xGa_{1-x}N$ quantum wells. Furthermore, for laser bars oriented at angles in between the c-axis and m-axis, the optical gain should decrease monotonically when rotating the longitudinal axis of the laser bars from the c-axis to the m-axis, with optimal laser bar orientations lying on or close to the c-axis.

This in-plane orientation-dependent gain is a new phenomenon currently unique to nonpolar or semipolar nitride diode lasers. Typical InP-based and GaAs-based diode lasers and c-plane GaN-based diode lasers exhibit gain characteristics that are isotropic with regards to laser bar orientation. Thus, this invention represents a new constraint in the design of diode lasers for the specific application to nonpolar or semipolar nitride diode lasers.

Moreover, these nonpolar or semipolar Group-III nitride diode lasers have improved manufacturability and performance, and can be used as optical sources for various commercial, industrial, or scientific applications. Indeed, these nonpolar or semipolar nitride diode lasers can be expected to find utility in the same applications as c-plane nitride diode lasers, including solid-state projection displays, high resolution printers, high density optical data storage systems, next generation DVD players, high efficiency solid-state lighting, optical sensing applications, and medical applications.

TECHNICAL DESCRIPTION

FIGS. 2A, 2B, 2C, 2D and 2E illustrate the coordinate system that will be used herein for defining diode laser bar orientation with respect to the optical polarization direction and the planes of its semiconductor crystal.

The diode laser bars shown comprise nonpolar Group-III nitride diode lasers having an axis of light propagation along its longitudinal axis that is substantially perpendicular to the mirror facets of the diode laser bars, wherein the optical polarization direction of the diode laser bars is determined by the crystallographic orientation of the diode laser bars. Optical gain in these diode laser bars is controlled by orienting the axis of light propagation, i.e., its longitudinal axis, in relation to the optical polarization direction or crystallographic orientation of the diode laser bars, wherein the axis of light propagation is oriented substantially perpendicular to the optical polarization direction to maximize optical gain.

Figure 2A:
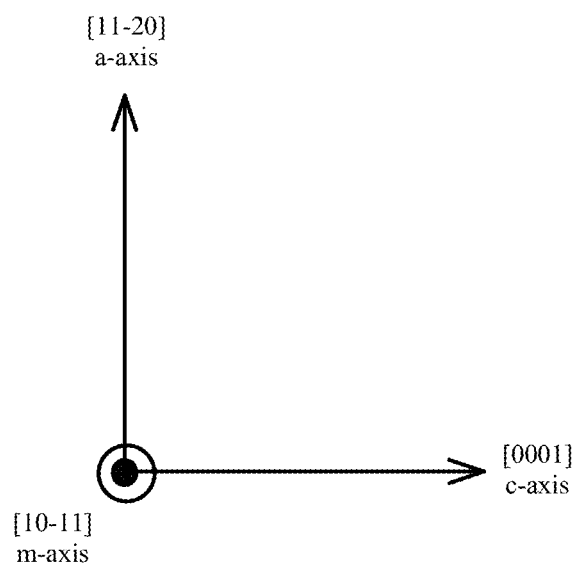
FIGS. 2A, 2B, 2C, 2D and 2E illustrate the coordinate system used for defining laser bar orientation with respect to the planes of the semiconductor crystal.
Figure 2B:
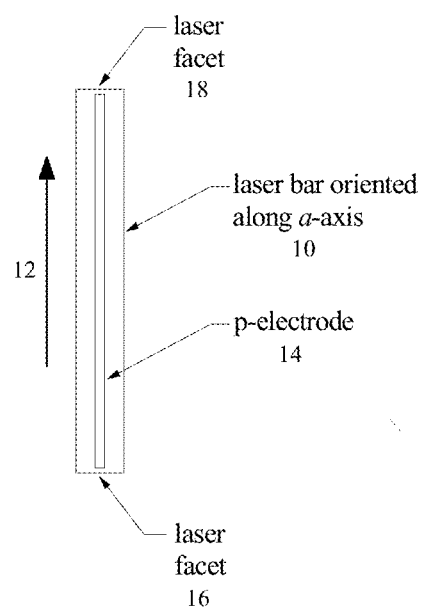
Figure 2C:
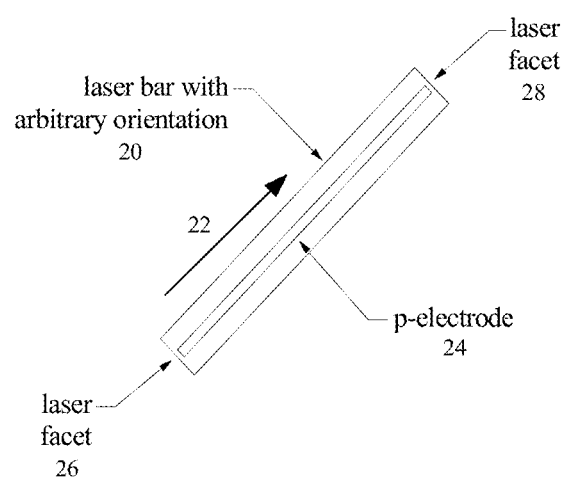
Figure 2D:
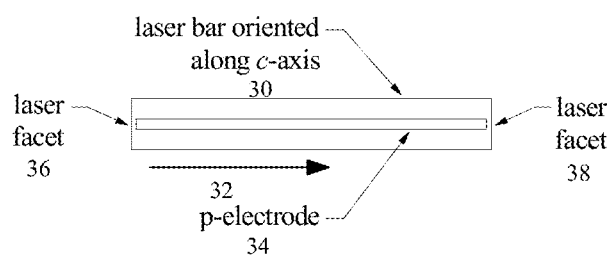

FIG. 2A illustrates the crystallographic orientations in the coordinate system, including the [10-11] m-axis, [11-20] a-axis, and [0001] c-axis, wherein the m-axis is normal to the surface of the figure and thus is depicted only as a point. FIGS. 2B, 2C and 2D are diode laser bars oriented within this coordinate system.

FIG. 2B shows a diode laser bar 10 fabricated on a free-standing nonpolar GaN substrate, wherein the m-axis of the substrate is normal to the surface of the figure. The diode laser bar 10 is oriented along the a-axis 12. Also shown are the p-electrode 14, and facets 16 and 18.

FIG. 2C shows a diode laser bar 20 fabricated on a free-standing GaN substrate, wherein the m-axis of the substrate is normal to the surface of the figure. The diode laser bar 20 is oriented along an arbitrary axis 22 between the a-axis and the c-axis. Also shown are the p-electrode 24, and facets 26 and 28.

FIG. 2D shows a diode laser bar 30 fabricated on a free-standing nonpolar GaN substrate, wherein the m-axis of the substrate is normal to the surface of the figure. The diode laser bar 30 is oriented along the c-axis 32. Also shown are the p-electrode 34, and facets 36 and 38.

Figure 2E:
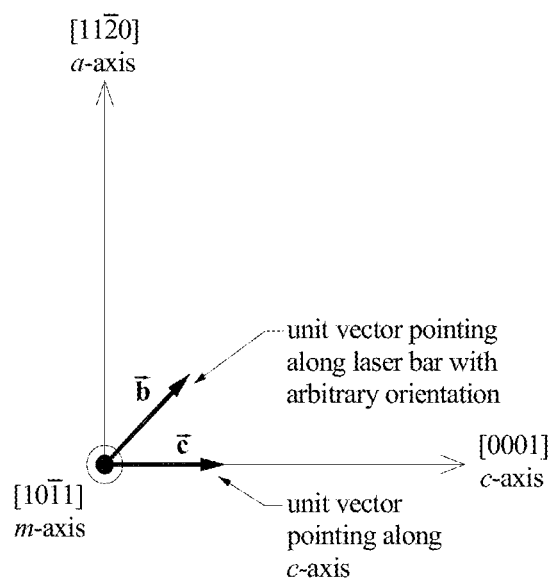

FIG. 2E further illustrates the crystallographic orientations of FIG. 2A, including the [10-11] m-axis, [11-20] a-axis, and [0001] c-axis. Also shown are unit vector b pointing along the longitudinal axis of the diode laser bar with arbitrary orientation and unit vector c pointing along longitudinal axis of the diode laser bar with a c-axis orientation.

To generate maximum optical gain, the axis of laser light propagation (i.e., the longitudinal axis of the diode laser bar) needs to be oriented substantially perpendicular to the optical polarization direction of the electroluminescence. Thus, for m-plane nitride diode lasers, the optical gain should be maximum for diode laser bars oriented along the c-axis and minimum for diode laser bars oriented along the a-axis due to the inherent optical polarization of compressively strained m-plane $In_xGa_{1-x}N$ quantum wells. Furthermore, for diode laser bars oriented at angles in between the c-axis and a-axis, the optical gain should decrease monotonically when rotating the longitudinal axis of the laser bars from the c-axis to the a-axis, with optimal diode laser bar orientations lying on or close to the c-axis.

In mathematical terms (see FIG. 2E), the optical gain will be maximum when the dot product of:

$$\vec{b} \cdot \vec{c}$$

is equal to one and minimum when it is equal to zero, where c is a unit vector pointing along the longitudinal axis of a diode laser bar with a c-axis orientation, and b is a unit vector pointing along the longitudinal axis of a diode laser bar with arbitrary orientation.

Likewise, for a-plane nitride diode lasers, the optical gain should be maximum for diode laser bars oriented along the c-axis and minimum for diode laser bars oriented along the m-axis due to the inherent optical polarization of compressively strained a-plane $In_xGa_{1-x}N$ quantum wells. Furthermore, for diode laser bars oriented at angles in between the c-axis and m-axis, the optical gain should decrease monotonically when rotating the longitudinal axis of the diode laser bars from the c-axis to the m-axis, with optimal diode laser bar orientations lying on or close to the c-axis.

For semipolar Group-III nitride diode lasers, the optical gain approaches a maximum when the axis of light propagation is oriented along a c-axis of the semipolar Group-III nitride diode laser and the optical gain approaches a minimum when the axis of light propagation is oriented along an m-axis or an a-axis of the semipolar Group-III nitride diode laser.

Experimental Results

In addition to theoretically predicting the effects of laser bar orientation on nonpolar nitride diode lasers, the inventors have also experimentally demonstrated these effects in m-plane nitride diode lasers grown by metal organic chemical vapor deposition (MOCVD) on free-standing m-plane GaN substrates manufactured by Mitsubishi Chemical Co., Ltd. These substrates were grown by hydride vapor phase epitaxy (HVPE) in the c-direction and then sliced to expose the m-plane surface. The m-plane surface was prepared by chemical and mechanical surface treatment techniques. The substrates have threading dislocation densities of less than $5 \times 10^6$ $cm^{-2}$, carrier concentrations of approximately $1 \times 10^{17}$ $cm^{-3}$, and RMS surface roughness of less than 1 nm, as measured by the manufacturer.

Figure 3:
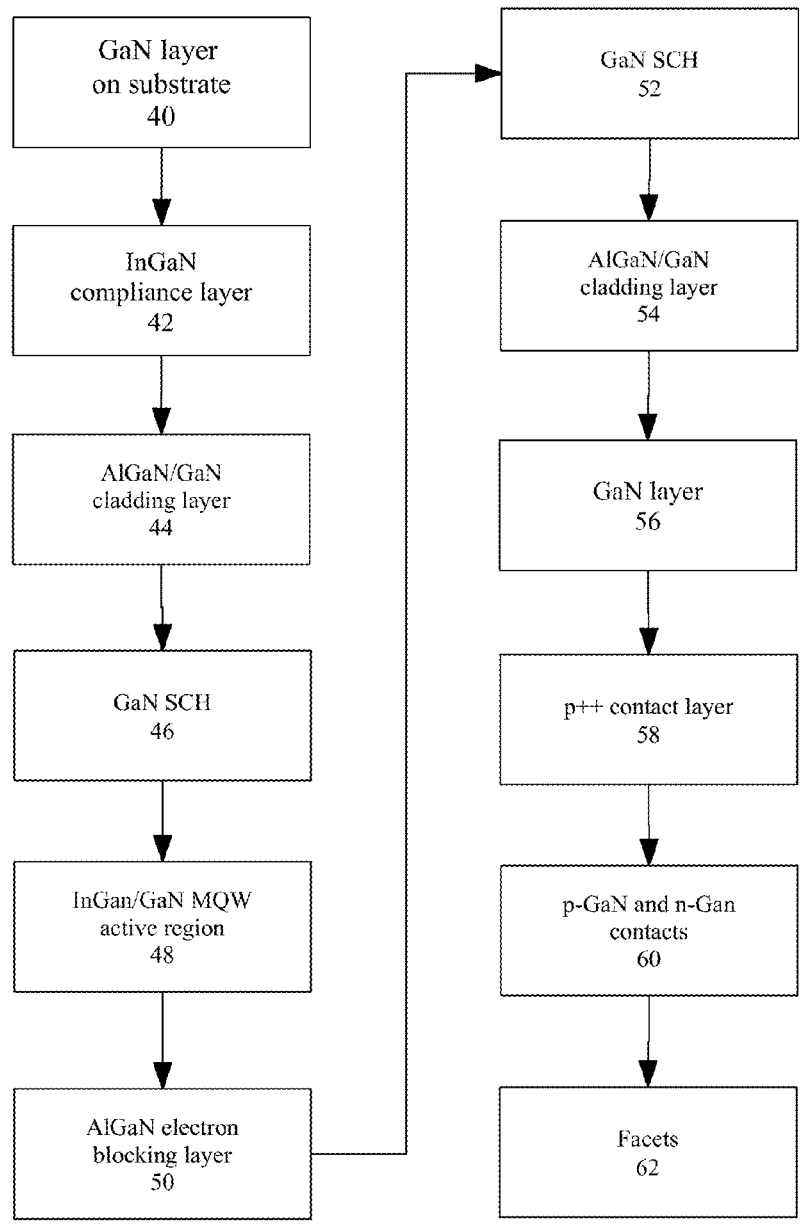
FIG. 3 is a flowchart that illustrates one embodiment of a process for fabricating an optoelectronic device.

FIG. 3 is a flowchart that illustrates one embodiment of a process for fabricating an optoelectronic device. The growth conditions were very similar to those typically used for c-plane nitride diode lasers. All MOCVD growth was performed at atmospheric pressure (AP), at typical V/III ratios (>3000), and at typical temperature ranges (875° C. to 1185° C.). A Si-doped GaN layer is first grown on top of a free-standing m-plane GaN substrate without a low temperature (LT) nucleation layer (40), followed by a 25 nm InGaN compliance layer (42) and a 250 period 2/2 nm AlGaN/GaN Si-doped cladding layer (44). Next, a 75 nm Si-doped GaN separate confined heterostructure (SCH) is grown (46), followed by a 5 period InGaN/GaN undoped MQW active region (48). The active region is capped with a 10 nm Mg-doped AlGaN electron blocking layer (50), followed by a 75 nm Mg-doped GaN SCH (52). This is followed by a 125 period 2/2 nm AlGaN/GaN Mg-doped cladding layer (54). Finally, a 150 nm p-type GaN layer (56) with a 20 nm p++ contact layer (58) are grown. The broad area lasers are then processed using Pd/Au and Ti/Al/Au as the p-type GaN and n-type GaN contacts (60), respectively. The laser facets are produced by reactive ion beam (RIE) etching (62).

Figure 4:
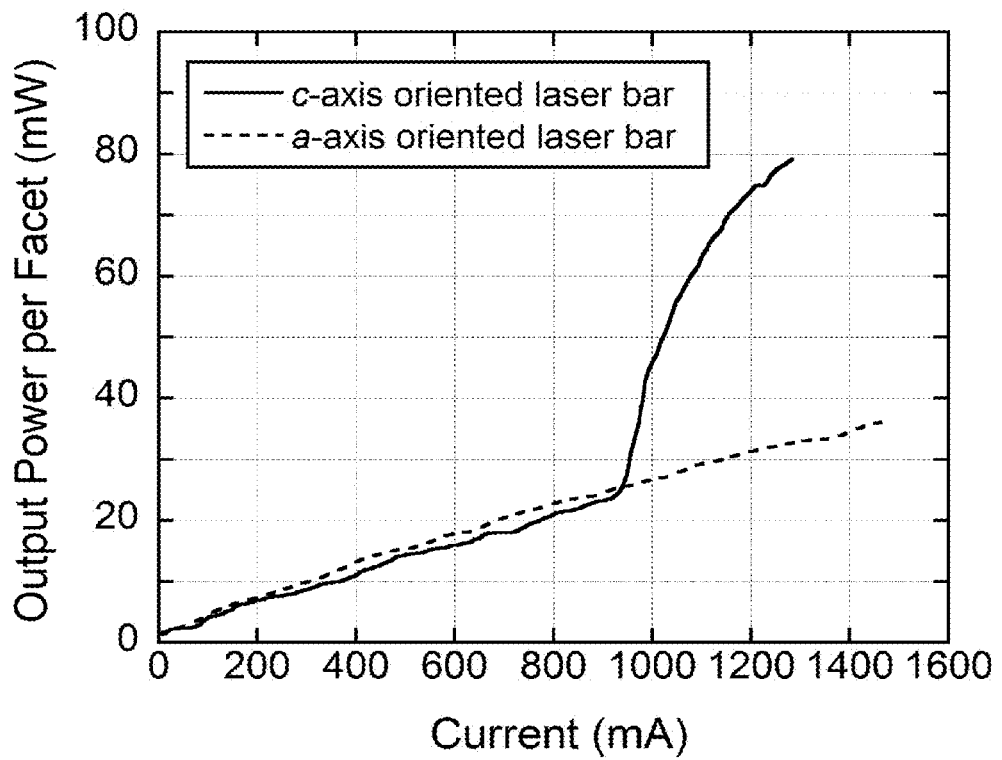
FIG. 4 illustrates light-current (L-I) characteristics for two separate nonpolar nitride diode lasers.

Testing was performed under pulsed conditions on laser bars without any heat sinking The data presented here was collected using a 200 μs period and 100 ns pulse width (corresponding to a 0.05% duty cycle), although lasing was observed for duty cycles up to 10%. FIG. 4 shows output power per facet (light) vs. current (L-I) curves for two broad area diode lasers with p-electrode stripe widths of 15 μm and cavity lengths of 600 μm. Both laser bars were grown and processed on the same free-standing m-plane GaN substrate, but they were oriented in different directions with regards to the planes of the semiconductor crystal. The longitudinal axis of one laser bar was aligned with the c-axis, while the longitudinal axis of the other laser bar was aligned with the a-axis. Clearly defined threshold characteristics were observed in the L-I curve of the laser bar oriented along the c-axis, while no lasing was observed for the laser bar oriented along the a-axis. For the laser bar oriented along the c-axis, the threshold current density ($J_{th}$) was approximately 10.3 kA/cm$^2$ and the peak output power was approximately 80 mW. The characteristics of these two L-I curves are representative of a number of laser bars tested in both orientations. All laser bars tested that were oriented along the c-axis lased, while all laser bars tested that were oriented along that a-axis did not lase within the limitations of the power supply.

The preferred way to practice this invention is to orient the longitudinal axis of the m-plane nitride laser bars along the c-axis for maximum optical gain. However, the scope of this invention also includes laser bars oriented at angles in between the c-axis and a-axis, with optimal laser bar orientations lying on or close to the c-axis.

Possible Modifications and Variations

Variations in nonpolar nitride quantum well and heterostructure design are possible without departing from the scope of the present invention. Moreover, the specific thickness and composition of the layers, in addition to the number of quantum wells grown, are variables inherent to particular device designs and may be used in alternative embodiments of the present invention. For instance, the III-nitride diode lasers described herein utilize $In_xGa_{1-x}N$-based quantum wells for light emission in the near UV region of the spectrum. However, the scope of the invention also includes diode lasers with $Al_xGa_{1-x}N$-based, $Al_xIn_{1-x}N$-based, and $Al_xIn_yGa_{1-x-y}N$-based quantum wells, which could be designed for light emission in other regions of the spectrum. Furthermore, potential diode laser designs may not even include quantum wells in their epitaxial structures. For example, such devices might employ a relatively thick double heterostructure as their active region.

Variations in MOCVD growth conditions such as growth temperature, growth pressure, V/III ratio, precursor flows, and source materials are also possible without departing from the scope of the present invention. Control of interface quality is an important aspect of the process and is directly related to the flow switching capabilities of particular reactor designs. Continued optimization of the growth conditions should result in more accurate compositional and thickness control of the nonpolar thin films and heterostructures described above.

Additional impurities or dopants can also be incorporated into the nonpolar nitride diode lasers described in this invention. For example, Fe, Mg, and Si are frequently added to various layers in nitride heterostructures to alter the conduction properties of those and adjacent layers. The use of such dopants and others not listed here are within the scope of the invention.

The preferred way to practice this invention is to orient the longitudinal axis of the m-plane nitride laser bars along the c-axis for maximum optical gain. However, the scope of this invention also includes laser bars oriented at any angle in between the c-axis and a-axis, with optimal laser bar orientations lying on or close to the c-axis. As noted above, in conjunction with FIGS. 2A-2E, any orientation of laser bars where the dot product of:

$$\vec{b} \cdot \vec{c}$$

is not equal to zero is acceptable for the practice of this invention.

The scope of this invention also covers more than just the two nonpolar nitride orientations (a-plane and m-plane) described herein. This idea is also pertinent to all semipolar planes that show in-plane orientation-dependent gain and require proper alignment of laser bars with respect to the planes of the semiconductor crystal. The term "semipolar plane" can be used to refer to any plane that cannot be classified as c-plane, a-plane, or m-plane. In crystallographic terms, a semipolar plane would be any plane that has at least two nonzero h, i, or k Miller indices and a nonzero l Miller index.

For more information on these nonpolar and semipolar crystallographic orientations, refer to U.S. Patent Publication No. 2007/0093073, U.S. patent application Ser. No. 11/444, 946, filed on Jun. 1, 2006, published on Apr. 26, 2007, by Robert M. Farrell et al., entitled TECHNIQUE FOR THE GROWTH AND FABRICATION OF SEMIPOLAR (Ga,Al, In,B)N THIN FILMS, HETEROSTRUCTURES, AND DEVICES, which is incorporated by reference herein.

This invention also covers the selection of particular crystal terminations and polarities. The use of braces, { }, throughout this specification denotes a family of symmetry-equivalent planes. Thus, the {10-12} family includes the (10-1-2), (-101-2), (1-10-2), (-110-2), (01-12), and (0-112) planes. All of these planes will be terminated by group III atoms, meaning that the crystal's c-axis points away from the substrate. This family of planes also includes the corresponding nitrogen terminated planes of the same indices. In other words, the {10-12} family also includes the (10-1-2), (-101-2), (1-20-2), (-110-2), (01-1-2), and (0-11-2) planes. For each of these growth orientations, the crystal's c-axis will point towards the substrate. All planes within a single crystallographic family are equivalent for the purposes of this invention, though the choice of polarity can affect the behavior of the growth process. In some applications, it would be desirable to grow on nitrogen terminated semipolar planes, while in other cases growth on group-III terminated planes would be preferred. Both terminations are acceptable for the practice of this invention.

Moreover, substrates other than free-standing nonpolar GaN could be used for nitride diode laser growth. The scope of this invention includes the growth and fabrication of nitride diode lasers on all possible crystallographic orientations of all possible substrates that show in-plane orientation-dependent gain and require proper alignment of laser bars with respect to the planes of the semiconductor crystal. These substrates include, but are not limited to, silicon carbide, gallium nitride, silicon, zinc oxide, boron nitride, lithium aluminate, lithium niobate, germanium, aluminum nitride, lithium gallate, partially substituted spinels, and quaternary tetragonal oxides sharing the γ-LiAlO$_2$ structure.

Furthermore, variations in nonpolar nitride nucleation (or buffer) layers and nucleation layer growth methods are acceptable for the practice of this invention. The growth temperature, growth pressure, orientation, and composition of the nucleation layers need not match the growth temperature, growth pressure, orientation, and composition of the subsequent nonpolar thin films and heterostructures. The scope of this invention includes the growth and fabrication of nonpolar diode lasers on all possible substrates using all possible nucleation layers and nucleation layer growth methods.

The nonpolar nitride diode lasers described above were grown on free-standing nonpolar GaN templates. However, the scope of this invention also covers nonpolar nitride diode lasers grown on epitaxial laterally overgrown (ELO) templates. The ELO technique is a method of reducing the density of threading dislocations (TD) in subsequent epitaxial layers. Reducing the TD density leads to improvements in device performance. For c-plane nitride diode lasers, these improvements include increased output powers, increased internal quantum efficiencies, longer device lifetimes, and reduced threshold current densities [15]. These advantages will be pertinent to all nonpolar nitride diode lasers grown on ELO templates.

The technical description presented above discussed nonpolar nitride diode lasers grown on free-standing nonpolar GaN substrates. Free-standing nonpolar nitride substrates may be creating by removing a foreign substrate from a thick nonpolar nitride layer, by sawing a bulk nitride ingot or boule into individual nonpolar nitride wafers, or by any other possible crystal growth or wafer manufacturing technique. The scope of this invention includes the growth and fabrication of nonpolar nitride diode lasers on all possible free-standing nonpolar nitride wafers created by all possible crystal growth methods and wafer manufacturing techniques.

Advantages and Improvements

The existing practice is to grow nonpolar nitride diode lasers along the polar [0001] c-direction. The associated polarization-induced electric fields and inherently large effective hole mass are detrimental to the performance of state-of-the-art c-plane nitride diode lasers. The advantage of the present invention is that the growth of nitride diode lasers along a nonpolar direction could significantly improve device performance by eliminating polarization effects and reducing the effective hole mass. Both of these effects should help to decrease the current densities necessary to generate optical gain in nitride diode lasers.

This invention claims that the benefits of nonpolar nitride diode lasers will not be realized without proper alignment of the longitudinal axis of the laser bars with regards to the planes of the semiconductor crystal. For m-plane nitride diode lasers, the optical gain should be maximum for laser bars oriented along the c-axis and minimum for laser bars oriented along the a-axis due to the inherent optical polarization of compressively strained m-plane In$_x$Ga$_{1-x}$N quantum wells. Furthermore, for laser bars oriented at angles in between the c-axis and a-axis, the optical gain should decrease monotonically when rotating the longitudinal axis of the laser bars from the c-axis to the a-axis, with optimal laser bar orientations lying on or close to the c-axis.

Likewise, for a-plane nitride diode lasers, the optical gain should be maximum for laser bars oriented along the c-axis and minimum for laser bars oriented along the m-axis due to the inherent optical polarization of compressively strained a-plane In$_x$Ga$_{1-x}$N quantum wells. Furthermore, for laser bars oriented at angles in between the c-axis and m-axis, the optical gain should decrease monotonically when rotating the longitudinal axis of the laser bars from the c-axis to the m-axis, with optimal laser bar orientations lying on or close to the c-axis.

This in-plane orientation-dependent gain is a new phenomenon unique to nonpolar nitride diode lasers. In contrast, typical InP-based and GaAs-based diode lasers and c-plane GaN-based diode lasers exhibit gain characteristics that are isotropic with regards to laser bar orientation. Thus, this invention represents a new constraint in the design of diode lasers for the specific application to nonpolar nitride diode lasers.

REFERENCES

The following references are incorporated by reference herein:
1. T. Takeuchi, S. Sota, M. Katsuragawa, M. Komori, H. Takeuchi, H. Amano, and I. Akasaki, Jpn. J. Appl. Phys., 36, L382 (1997).
2. P. Lefebvre, A. Morel, M. Gallart, T. Taliercio, J. Allegre, B. Gil, H. Mathieu, B. Damilano, N. Grandjean, and J. Massies, Appl. Phys. Lett., 78, 1252 (2001).
3. N. Grandjean, B. Damilano, S. Dalmasso, M. Leroux, M. Laugt, and J. Massies, J. Appl. Phys., 86, 3714 (1999).
4. J. S. Im, H. Kollmer, J. Off, A. Sohmer, F. Scholz, and A. Hangleiter, Phys. Rev. B, 57, R9435 (1998).
5. A. Di Carlo, F. Della Sala, P. Lugli, V. Fiorentini, and F. Bernardini, Appl. Phys. Lett., 76, 3950 (2000).
6. F. Della Sala, A. Di Carlo, P. Lugli, F. Bernardini, V. Fiorentini, R. Scholz, and J. M. Jancu, Appl. Phys. Lett., 74, 2002 (1999).
7. M. Suzuki and T. Uenoyama, Jpn. J. Appl. Phys., 35, 1420 (1996).
8. E. Yablonovitch and E. O. Kane, J. Lightwave Tech., 4, 504 (1986).
9. S. H. Park, J. Appl. Phys., 91, 9904 (2002).
10. S. H. Park, Jpn. J. Appl. Phys, 42, L170 (2003).
11. S. H. Park, J. Appl. Phys., 93, 9665 (2003).
12. N. F. Gardner, J. C. Kim, J. J. Wierer, Y. C. Shen, and M. R. Krames, Appl. Phys. Lett., 86, 111101 (2005).
13. H. Masui, A. Chakraborty, B. A. Haskell, U. K. Mishra, J. S. Speck, S. Nakamura, S. P. Denbaars, Jpn. J. Appl. Phys, 44, L1329 (2005).
14. T. Koyama, T. Onuma, H. Masui, A. Chakraborty, B. A. Haskell, S. Keller, U. K. Mishra, J. S. Speck, S. Nakamura, S. P. Denbaars, T. Sota, S. F. Chichibu, Appl. Phys. Lett., 89, 091906 (2006).
15. S. Nakamura, M. Senoh, S. Nagahama, N. Iwasa, T. Yamada, T. Matsushita, H. Kiyoku, Y. Sugimoto, T. Kozaki, H. Umemoto, M. Sano, and K. Chocho, Appl. Phys.
16. S. Nakamura and G. Fasol, The Blue Laser Diode, (Springer, Heidelberg, 1997). This book provides an overview of c-plane (Ga,Al,In,B)N optoelectronics technology.
17. L. Coldren and S. Corzine, Diode Lasers and Photonic Integrated Circuits, (Wiley Interscience, New York, 1995). Chapters 4 and Appendices 8-11 discuss the theory relevant to the design of strained quantum well lasers.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An optoelectronic device, comprising:
a Group-III nitride diode laser having in-plane, orientation-dependent, optical gain, wherein laser bars of the Group-III nitride diode laser are oriented with regards to planes of its semiconductor crystal to control the optical gain, the optical gain is at a maximum when the laser bars are oriented along a projection of a c-axis, and the optical gain is at a minimum when the laser bars are oriented along an a-axis.

2. The device of claim 1, wherein the Group-III nitride diode laser is a nonpolar or semipolar the Group-III nitride diode laser.

3. The device of claim 1, wherein the optical gain is controlled by orienting an axis of light propagation in relation to an optical polarization direction resulting from a crystallographic orientation of semiconductor materials used in the Group-III nitride diode laser.

4. The device of claim 1, wherein the optical gain decreases monotonically when rotating a longitudinal axis of the laser bars from the projection of the c-axis to the a-axis.

5. The device of claim 1, wherein the Group-III nitride diode laser has an axis of light propagation along its longitudinal axis that is substantially perpendicular to its mirror facets, and an optical polarization direction of the Group-III nitride diode laser is determined by a crystallographic orientation of the laser bars.

6. An optoelectronic device, comprising:
a Group-III nitride diode laser having in-plane, orientation-dependent, optical gain, wherein laser bars of the Group-III nitride diode laser are oriented with regards to planes of its semiconductor crystal to control the optical gain, the optical gain is at a maximum when the laser bars are oriented along a projection of a c-axis and the optical gain is at a minimum when the laser bars are oriented along an m-axis.

7. The device of claim 6, wherein the optical gain decreases monotonically when rotating a longitudinal axis of the laser bars from the projection of the c-axis to the m-axis.

8. The device of claim 6, wherein the Group-III nitride diode laser is a nonpolar or semipolar the Group-III nitride diode laser.

9. The device of claim 6, wherein the optical gain is controlled by orienting an axis of light propagation in relation to an optical polarization direction resulting from a crystallographic orientation of semiconductor materials used in the Group-III nitride diode laser.

10. A method for fabricating an optoelectronic device, comprising:
fabricating a Group-III nitride diode laser having in-plane, orientation-dependent, optical gain, wherein laser bars of the Group-III nitride diode laser are oriented with regards to planes of its semiconductor crystal to control the optical gain, the optical gain is at a maximum when the laser bars are oriented along a projection of a c-axis and the optical gain is at a minimum when the laser bars are oriented along an a-axis.

11. The method of claim 10, wherein the Group-III nitride diode laser is a nonpolar or semipolar the Group-III nitride diode laser.

12. The method of claim 10, wherein the optical gain is controlled by orienting an axis of light propagation in relation to an optical polarization direction resulting from a crystallographic orientation of semiconductor materials used in the Group-III nitride diode laser.

13. The method of claim 10, wherein the optical gain decreases monotonically when rotating a longitudinal axis of the laser bars from the projection of the c-axis to the a-axis.

14. The method of claim 10, wherein the Group-III nitride diode laser has an axis of light propagation along its longitudinal axis that is substantially perpendicular to its mirror facets, and an optical polarization direction of the Group-III nitride diode laser is determined by a crystallographic orientation of the laser bars.

15. An optoelectronic device fabricated using the method of claim 10.

16. A method for fabricating an optoelectronic device, comprising:
fabricating a Group-III nitride diode laser having in-plane, orientation-dependent, optical gain, wherein laser bars of the Group-III nitride diode laser are oriented with regards to planes of its semiconductor crystal to control the optical gain, the optical gain is at a maximum when the laser bars are oriented along a projection of a c-axis and the optical gain is at a minimum when the laser bars are oriented along an m-axis.

17. The method of claim 16, wherein the optical gain decreases monotonically when rotating a longitudinal axis of the laser bars from the projection of the c-axis to the m-axis.

18. An optoelectronic device fabricated using the method of claim 16.

19. The method of claim 16, wherein the Group-III nitride diode laser is a nonpolar or semipolar the Group-III nitride diode laser.

20. The method of claim 16, wherein the optical gain is controlled by orienting an axis of light propagation in relation to an optical polarization direction resulting from a crystallographic orientation of semiconductor materials used in the Group-III nitride diode laser.

* * * * *